(12) United States Patent
Park et al.

(10) Patent No.: US 12,552,192 B2
(45) Date of Patent: Feb. 17, 2026

(54) SELECTIVE STENCIL MASK AND A STENCIL PRINTING METHOD

(71) Applicant: STATS ChipPAC Pte. Ltd., Singapore (SG)

(72) Inventors: HyunSeok Park, Gyeonggi-do (KR); KyoWang Koo, Incheon (KR); SeongKuk Kim, Gyeonggi-do (KR); SeokBeom Heo, Incheon (KR)

( * ) Notice: Subject to any disclaimer, the term of this patent is extended or adjusted under 35 U.S.C. 154(b) by 0 days.

(21) Appl. No.: 18/619,148

(22) Filed: Mar. 27, 2024

(65) Prior Publication Data
US 2024/0343055 A1  Oct. 17, 2024

(30) Foreign Application Priority Data
Mar. 29, 2023  (CN) .......................... 202310326565.8

(51) Int. Cl.
*B23K 1/00* (2006.01)
*B23K 1/20* (2006.01)
(Continued)

(52) U.S. Cl.
CPC ............ *B41N 1/248* (2013.01); *B23K 1/0016* (2013.01); *B23K 1/203* (2013.01); *B41C 1/148* (2013.01);
(Continued)

(58) Field of Classification Search
CPC ........ B41N 1/248; B41N 1/24; B23K 1/0016; B23K 1/203; B23K 2101/40; B23K 3/0623; B23K 2101/36–42; B41C 1/148; B41C 1/145; B41M 1/12; B41M 1/26; G03F 7/0035; G03F 1/50; G03F 1/68; H01L 24/11; H01L 24/81; H01L 2224/1147; H01L 2224/81815; H01L 24/13; H01L 24/16; H01L 24/14; H01L 24/03; H01L 2224/0332; H01L 2224/03822;
(Continued)

(56) References Cited

U.S. PATENT DOCUMENTS 5,135,606 A * 8/1992 Kato .................... H01R 12/714
205/135
5,641,113 A * 6/1997 Somaki ................ H05K 3/3436
29/879
(Continued)

FOREIGN PATENT DOCUMENTS

CN      1841795 A  * 10/2006 ............. H01L 24/81
CN    102593067 B  *  9/2014 ............. H01L 24/81
(Continued)

*Primary Examiner* — Kiley S Stoner
(74) *Attorney, Agent, or Firm* — Junhe Law Office, P.C.; Yi Zhang

(57) ABSTRACT

A selective stencil mask and a stencil printing method are provided. The stencil mask is for printing a fluid material onto a substrate, and comprises: a stencil member comprising: at least one printing region each having an array of apertures that allow the fluid material to flow therethrough and deposit onto the substrate; and a blocking region configured to prevent the fluid material from flowing therethrough; and a supporting member attached to the stencil member and configured to, when the stencil mask is placed on the substrate, contact the substrate and create a gap between the stencil member and the substrate.

10 Claims, 6 Drawing Sheets

(51) Int. Cl.
  *B41C 1/14* (2006.01)
  *B41M 1/12* (2006.01)
  *B41M 1/26* (2006.01)
  *B41N 1/24* (2006.01)
  *G03F 7/00* (2006.01)
  *H01L 23/00* (2006.01)
  *B23K 101/40* (2006.01)

(52) U.S. Cl.
  CPC ............... *B41M 1/12* (2013.01); *B41M 1/26* (2013.01); *G03F 7/0035* (2013.01); *H01L 24/11* (2013.01); *H01L 24/81* (2013.01); *B23K 2101/40* (2018.08); *H01L 2224/1147* (2013.01); *H01L 2224/81815* (2013.01)

(58) Field of Classification Search
  CPC . H01L 2224/03828; H01L 2224/03849; H01L 2224/1132; H01L 2224/11618; H01L 2224/11622; H01L 2224/11849; H01L 2224/14104
  USPC ...... 228/33, 37, 41, 179.1–180.22, 223–224, 228/214–215, 207
  See application file for complete search history.

(56) References Cited

U.S. PATENT DOCUMENTS

| | | | |
|---|---|---|---|
| 6,184,586 B1 * | 2/2001 | Matsushima | H05K 3/3436 257/E21.511 |
| 7,425,468 B2 | 9/2008 | Wang et al. | |
| 8,183,143 B2 | 5/2012 | Stacey | |
| 9,865,479 B2 | 1/2018 | Wang et al. | |
| 2001/0000925 A1 * | 5/2001 | Caletka | H01L 23/49816 257/E21.511 |
| 2002/0146646 A1 * | 10/2002 | Jao | H01L 24/11 430/312 |
| 2007/0099413 A1 * | 5/2007 | Shiu | H05K 3/3485 257/E21.508 |
| 2007/0269973 A1 * | 11/2007 | Nalla | H05K 3/3478 257/E21.508 |
| 2008/0102620 A1 * | 5/2008 | Sakaguchi | H05K 3/3478 257/E21.508 |
| 2010/0140796 A1 * | 6/2010 | Ishido | H01L 23/49811 257/737 |
| 2010/0147928 A1 * | 6/2010 | Wettermann | B23K 3/0638 228/256 |
| 2011/0272802 A1 * | 11/2011 | Ogashiwa | H01L 24/17 257/737 |
| 2012/0252168 A1 * | 10/2012 | Nah | H01L 21/4853 257/E21.502 |
| 2014/0065771 A1 * | 3/2014 | Gruber | H05K 3/3436 257/E21.506 |
| 2017/0141073 A1 * | 5/2017 | Lu | H01L 24/05 |
| 2017/0278816 A1 * | 9/2017 | Li | H01L 24/11 |
| 2017/0301559 A1 * | 10/2017 | Wang | H05K 3/1216 |
| 2018/0053739 A1 * | 2/2018 | Seddon | H01L 24/03 |
| 2020/0266168 A1 * | 8/2020 | Niwa | H01L 24/05 |
| 2022/0173063 A1 * | 6/2022 | Li | H01L 24/11 |
| 2022/0190219 A1 | 6/2022 | Loh et al. | |
| 2022/0367334 A1 * | 11/2022 | Huang | H01L 21/4857 |
| 2024/0343055 A1 * | 10/2024 | Park | B23K 3/0623 |
| 2025/0282908 A1 * | 9/2025 | Choi | H01L 24/13 |

FOREIGN PATENT DOCUMENTS

| | | | | |
|---|---|---|---|---|
| CN | 107527901 A | * | 12/2017 | ......... H01L 25/0652 |
| CN | 109637990 A | * | 4/2019 | ............ H01L 24/11 |
| CN | 105914165 B | * | 8/2019 | ........... H01L 23/488 |
| CN | 112151392 A | * | 12/2020 | ............ H01L 24/17 |
| CN | 112885803 A | * | 6/2021 | ............ H01L 24/11 |
| CN | 114927423 A | * | 8/2022 | ............ H01L 24/11 |
| JP | H0661233 A | * | 3/1994 | ............ H01L 24/11 |
| JP | 2002141367 A | * | 5/2002 | ............ H01L 24/16 |
| JP | 3500032 B2 | * | 2/2004 | |
| JP | 2004266146 A | * | 9/2004 | |
| JP | 2004311847 A | * | 11/2004 | ........... H05K 3/4007 |
| JP | 2008109059 A | * | 5/2008 | ............ H01L 24/32 |
| JP | 2010103196 A | * | 5/2010 | ............ H01L 24/81 |
| JP | 2010205996 A | * | 9/2010 | ............ H01L 24/11 |
| JP | 2015226046 A | * | 12/2015 | ............ H01L 24/81 |
| JP | 2016154193 A | * | 8/2016 | ............ H01L 24/03 |
| JP | 2017175018 A | * | 9/2017 | ............ H01L 24/17 |
| KR | 20110027609 A | * | 3/2011 | ............ H01L 21/56 |
| KR | 20230071548 A | * | 5/2023 | ............ H01L 24/16 |
| TW | 200603371 A | | 1/2006 | |
| TW | 200917381 A | * | 4/2009 | ......... H01L 23/3135 |
| TW | 1711347 B | * | 11/2020 | ............ H01L 24/81 |
| TW | 202203403 A | | 1/2022 | |
| TW | 202213673 A | * | 4/2022 | ........... H01L 25/105 |
| TW | 1797904 B | * | 4/2023 | ....... H01L 23/49816 |

* cited by examiner

SELECTIVE STENCIL MASK AND A STENCIL PRINTING METHOD

TECHNICAL FIELD

The present application generally relates to semiconductor manufacturing technologies, and more particularly, to a stencil mask and a stencil printing method.

BACKGROUND

The semiconductor industry is constantly faced with complex integration challenges as consumers want their electronics to be smaller, faster and higher performance with more and more functionalities packed into a single device. It is desired to have a big size die with high bump counts and fine bump pitch such as below 100 um. However, with the currently available flip chip fluxing dipping methods, such dice are often obtained with non-wetting solder bumps occurring at a peripheral area of the die and die bump bridges at a central area of the die due to die warpage.

Therefore, a need exists for an improved stencil mask and a stencil printing process.

SUMMARY

An objective of the present application is to provide a stencil mask that can improve quality of solder bumps on a substrate when such stencil mask is used in a stencil printing process.

According to an aspect of the present application, there is provided a stencil mask for printing a fluid material onto a substrate, wherein the stencil mask comprises: a stencil member comprising: at least one printing region each having an array of apertures that allow the fluid material to flow therethrough and deposit onto the substrate; and a blocking region configured to prevent the fluid material from flowing therethrough; and a supporting member attached to the stencil member and configured to, when the stencil mask is placed on the substrate, contact the substrate and create a gap between the stencil member and the substrate.

According to another aspect of the present application, there is provided a stencil printing method, comprising: providing a substrate, wherein the substrate comprises at least one printing area; providing a stencil mask, wherein the stencil mask comprises: a stencil member comprising at least one printing region each having an array of apertures that allow a fluid material to flow therethrough, and a blocking region for preventing the fluid material from flowing therethrough; and a supporting member attached to the stencil member; placing the stencil mask on the substrate to create a gap between the stencil member and the substrate with the supporting member and align the at least one the printing region with the at least one printing area, respectively; and depositing a fluid material onto the substrate through the at least one printing region such that the fluid material flows through the at least one array of apertures onto the at least one printing area.

According to a further aspect of the present application, there is provided a method for forming a semiconductor package, comprising: providing a first substrate and a second substrate; forming in a first region of the first substrate a first plurality of solder bumps using a first stencil mask; forming in a second region of the first substrate a second plurality of solder bumps using a second stencil mask; forming solder bumps on the second substrate; aligning the first plurality of solder bumps and the second plurality of solder bumps on the first substrate with the solder bumps on the second substrate to connect the first substrate with the second substrate; and reflowing the first plurality of solder bumps and the second plurality of solder bumps on the first substrate and the solder bumps on the second substrate.

According to yet a further aspect of the present application, there is provided a method for forming a stencil mask, comprising: providing a substrate; forming on the substrate a first photoresist pattern having first openings; filling in the first openings of the first photoresist pattern a first plating material; forming on the first photoresist pattern a second photoresist pattern having second openings; filling in the second openings of the second photoresist pattern a second plating material; and removing the first photoresist pattern and the second photoresist pattern from the substrate.

According to yet a further aspect of the present application, there is provided a method for forming a semiconductor package, comprising: providing a first substrate and a second substrate; forming in a first region of the first substrate a first plurality of solder bumps and in a second region of the first substrate a second plurality of solder bumps using a first stencil mask; depositing onto the second plurality of solder bumps flux using a second stencil mask; forming solder bumps on the second substrate; aligning the first plurality of solder bumps and the second plurality of solder bumps on the first substrate with the solder bumps on the second substrate to connect the first substrate with the second substrate; and reflowing the first plurality of solder bumps and the second plurality of solder bumps on the first substrate and the solder bumps on the second substrate.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF THE DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

DETAILED DESCRIPTION OF THE PREFERRED EMBODIMENTS

Figure 1A:
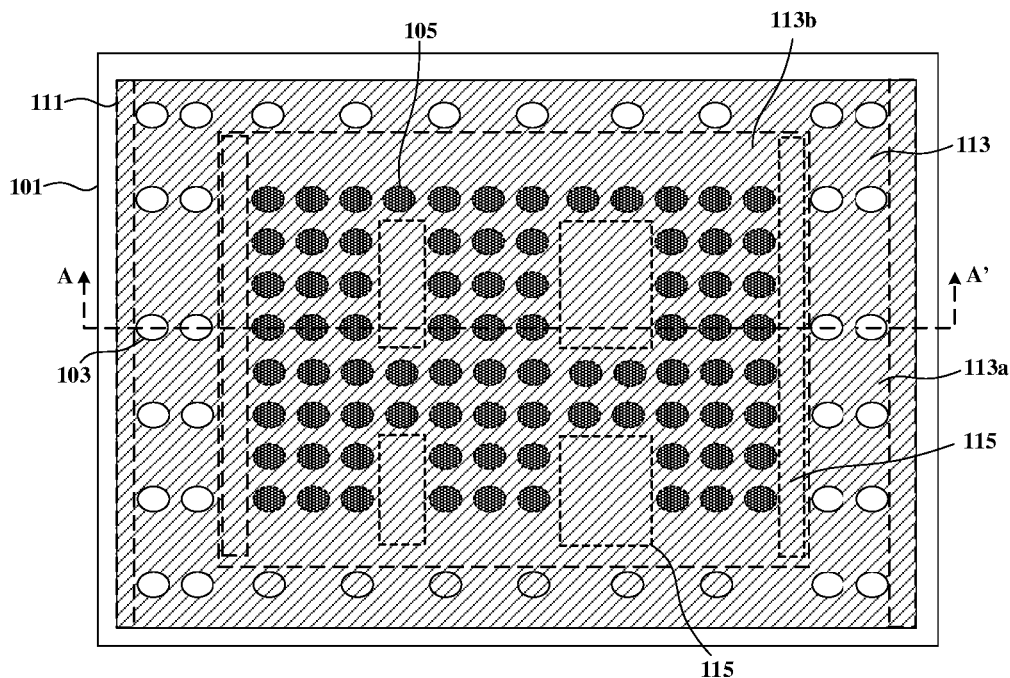
FIGS. 1A, 1B, and 1C respectively illustrate a substrate with a stencil mask attached thereon, according to an embodiment of the present application.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one sub-unit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

It is found by the inventors of the present application that a conventional stencil printing process may produce a substrate with solder bump bridges in a central area of the substrate due to fine solder bump pitches, and produce non-wetting solder bumps in a peripheral area of the substrate due to substrate warpage during a reflow process. The solder bump bridges and non-wetting solder bumps both reduce the yield of semiconductor products manufactured using the conventional stencil printing process, and thus undesired. Various measures have been taken trying to address the problems. For example, deep flux dipping in the specific non-wetting edge areas and squeegee printing are usually adopted to overcome these issues. However, these methods may lead to either more solder bump bridges or undesired squeeze pressure on the substrate.

In order to further improve the conventional stencil printing process, a new stencil mask and a stencil printing process using such stencil mask are proposed for printing a fluid material onto a substrate such as a printed circuit board, a semiconductor die or a semiconductor package. The stencil mask is a selective stencil mask that has a printing region and a blocking region. The blocking region is generally free of apertures so that no fluid material can flow through the stencil mask in the blocking region. Furthermore, the printing region has apertures that allow the fluid material to flow therethrough and deposit onto the substrate. With such stencil mask, the fluid material can be selectively printed onto the substrate, for example, in a region that requires solder bumps with a first pitch; furthermore, the other region of the substrate may be printed with solder bumps with a second pitch using another stencil mask, or using another type of solder forming process. Since the solder bumps in the two regions of the substrate are formed with different stencil masks or even different processes, different amounts of fluid materials may be used for solder bumps in different regions to allow for better wetting of the solder bumps and different pitches.

Figure 1B:
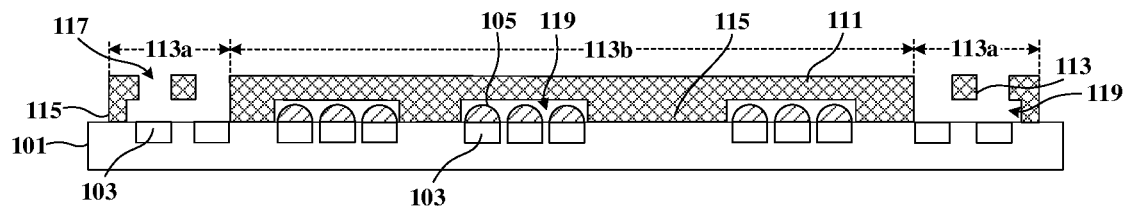
Figure 1C:
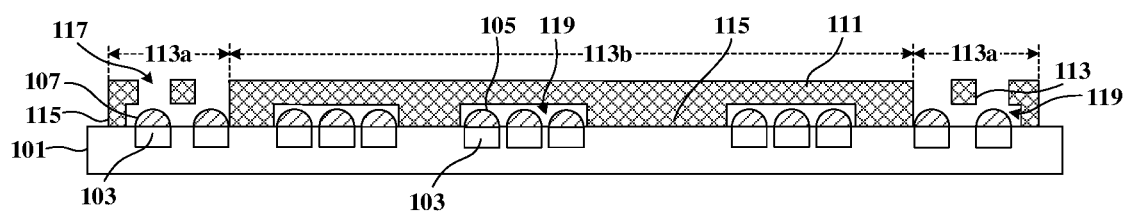

FIGS. 1A, 1B, and 1C respectively illustrate a substrate 101 with a stencil mask 111 attached thereon, according to an embodiment of the present application. FIG. 1A is a top view of the substrate 101, FIGS. 1B and 1C are respective cross sectional views of the substrate 101 along line AA' in FIG. 1A, before and after a fluid material is deposited onto the substrate 101 through the stencil mask 111.

Referring to FIGS. 1A and 1B, the stencil mask 111 is placed on the substrate 101 such a semiconductor package or a printed circuit board. The substrate 101 has various conductive patterns 103 such as redistribution layers (RDL). In the embodiment, the substrate 101 is partially formed with solder bumps 105, for example, at the central position of the substrate 101, which can be electrically connected to the respective conductive patterns 103. It can be appreciated that the central position may be a position relatively closer to a center of the substrate 101, compared with a peripheral position of the substrate 101. However, it is not required that the central positions should be at the center of the substrate 101. In some embodiments, the solder bumps 105 formed on the substrate 101 may be pre-formed using another stencil printing process or another type of solder bump forming process. Accordingly, the stencil printing process may be performed in the remaining portion of the substrate 101 where no solder bumps are formed using the stencil mask 111, i.e., in a bump free region. It can be appreciated that in some other embodiments, the solder bumps 105 in the bump region of the substrate 101 may formed at a later stage using another stencil mask and stencil printing process.

In particular, the stencil mask 111 includes a stencil member 113 and a supporting member 115 for supporting the stencil member 113. In the embodiment, the stencil member 113 takes the form of a generally flat plate, with apertures 117 formed through certain regions thereof. Corresponding to the substrate 101 not fully formed with solder bumps, the stencil member 113 includes at least one printing region 113*a* with apertures and a blocking region 115 without apertures. In some embodiments, the printing regions 113*a* may be distributed across the substrate 101, with each of them having an array of apertures. The supporting member 115 is attached to the stencil member 113, for example, beneath the stencil member 113. In some embodiments, the stencil member 113 and the supporting member 115 may be formed together as a single piece using a single process, or may be formed separately using two processes and attached with each other subsequently.

When the stencil mask 111 is placed on the substrate 101 as shown in FIGS. 1A and 1B, the supporting member 115 may contact the substrate 101 and create a gap 119 between the stencil member 113 and the substrate 101. The printing region 113a which has apertures 117 can allow the fluid material such as a solder material to flow therethrough and deposit onto the substrate 101. In this way, the solder bumps on the substrate 101 can be formed in different batches and processes to have different characteristics such as different sizes, pitches, and/or fluid materials. Differently, the gap 119 between the stencil member 113 and the substrate 101 can accommodate solder bumps already formed on the substrate 101. With the created gap 119, the stencil member 113 would not apply any pressure on the previously formed solder bumps 105 and would not cause any damages thereto. The printability of the fluid material is also improved due to a gap printing effect. That is, the fluid material can be easily swept to the desired positions of the stencil member 111 by a squeegee during the printing process.

In the embodiment shown in FIGS. 1A and 1B, the supporting member 115 includes multiple supporting bars. In some embodiments, the support member 115 may include multiple supporting pins or other similar structures. When the stencil mask 111 is placed on the substrate 101, the supporting bars may be disposed at locations of the substrates 101 where no solder bumps 105 are previously formed, i.e., in bump free regions. Thus, the supporting bars provide anchors for the stencil member 113 on the substrate 101. Although not shown in FIG. 1B, the supporting member 115 may not only have supporting bars under the blocking region 113b, but also have supporting bars under some of the printing region 113a, as long as they do not interfere with the formation of the solder bumps to be formed. For example, some supporting bars may be disposed close to or at the edges of the stencil member 113, but may not be disposed right under the apertures 117. Preferably, the supporting bars may be distributed generally uniformly across the stencil member 113 to avoid excess stresses at some specific locations of the stencil mask when a squeegee is sweeping the fluid material along the stencil mask 111. It can be appreciated that the supporting bars should have a height greater than that of the solder bumps 105 already formed and the solder bumps to be formed, so as to not damage the solder bumps. In some embodiments, the supporting bars may be 20 um to 5 mm higher than the maximum height of the solder bumps.

In some embodiment, such as the embodiment shown in FIG. 1A, the blocking region 113b is at a central position of the stencil member 113, and the printing region 113a is at a peripheral position of the stencil member 113 and surrounds the blocking region 113b. In some other embodiments, the printing region 113a may take the form of several separated regions that are separated by the blocking region 113b and have respective arrays of apertures 117.

Referring to FIG. 1C which illustrates the cross sectional view of the substrate 101 after the stencil printing process is performed, with the printing region 113a positioned at a peripheral position of the stencil member 113, the fluid material such as the solder material may flow through the stencil member 113 and deposit onto the peripheral position of the substrate 101 via the arrays of apertures 117, thus forming solder bumps 107 as desired. Meanwhile, the blocking region 113b can prevent the fluid material from flowing therethrough and depositing onto the central position of the substrate 101. With the selective stencil mask, a sufficient amount of fluid material can be deposited at the peripheral position of the substrate 101 while no additional fluid material is applied at the central position of the substrate 101. In this way, the solder bumps 107 at the peripheral position of the substrate 101 can have a sufficient amount of fluid material that provides enough wetting angle for the solder bumps during a reflow process, while the solder bumps 105 at the central position of the substrate 101 can be prevented from developing any undesired solder bump bridges since a smaller amount of fluid material may be used in the previous stencil printing process for forming the solder bumps 105.

The stencil mask 111 may be made of stainless steel, nickel, brass or other suitable material. Further, the stencil mask 111 can be used for printing any desired fluid material onto any other types of substrate such as a glass plate, a steel plate, a printed circuit board, a semiconductor substrate, a semiconductor die or a semiconductor package, etc. For example, the substrate 101 may be a PCB, a laminate interposer, a strip interposer, a leadframe, or another suitable substrate. The substrate 101 may include one or more insulating or passivation layers, one or more conductive vias formed through the insulating layers, and one or more conductive layers formed over or between the insulating layers. The substrate 101 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, or other reinforcement fibers or fabrics. The substrate 101 may also be a multi-layer flexible laminate, ceramic, copper clad laminate, glass, or semiconductor wafer including an active surface containing one or more transistors, diodes, and other circuit elements to implement analog circuits or digital circuits. The substrate 101 may include one or more electrically conductive layers or redistribution layers (RDL) formed using sputtering, electrolytic plating, electroless plating, or other suitable deposition process. The conductive layers may be one or more layers of Al, Cu, Sn, Ni, Au, Ag, Ti, W, or other suitable electrically conductive material. In some embodiments, one or more conductive patterns may be exposed for the surface of the substrate 101, and subsequently connected with one or more external electronic components.

FIGS. 2A to 2E illustrate a process for forming bonding between two substrates according to an embodiment of the present application. In some embodiments, the process can be used in a process for forming a semiconductor package including the two substrates.

Figure 2A:
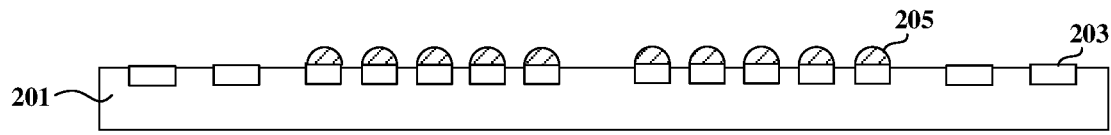
FIGS. 2A to 2E illustrate a process for forming bonding between two substrates according to an embodiment of the present application.

As illustrated in FIG. 2A, a first substrate 201 may be provided, which may have a first plurality of solder bumps 205 in a central region of the substrate 201. For example, the first plurality of solder bumps 205 may be formed using a first stencil printing process, which may allow for a fine pitch such as 90 um or even smaller. A portion of the top surface of the substrate 201, which is generally in a peripheral region of the substrate 201, may be free of solder bumps and thus some conductive patterns 203 may be exposed.

Figure 2B:
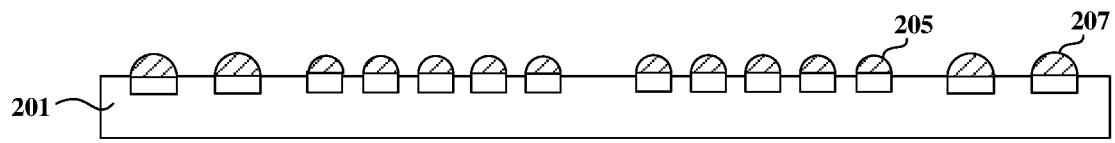

Afterwards, as illustrated in FIG. 2B, a second stencil printing process may be performed to the first substrate 201, to form a second plurality of solder bumps 207 in the peripheral region of the substrate 201. The second plurality of solder bumps 207 can cover the exposed conductive patterns 203 and be electrically connected to them. In the embodiment, the second stencil printing process may be implemented using the stencil mask shown in the embodiment with reference to FIGS. 1A to 1C. Since it is a process different from the first stencil printing process, the second stencil printing process may be implemented using a different configuration. For example, the aperture size of the stencil mask, the amount of solder material for the second plurality of solder bumps 207, and/or the pitch for the second plurality of solder bumps may be different from those of the first plurality of solder bumps 205. As mentioned above, the stencil mask used in the second stencil printing process provides a gap that can accommodate the first plurality of solder bumps 205 and protect them from damages and contaminations during the second stencil printing process.

Figure 2C:
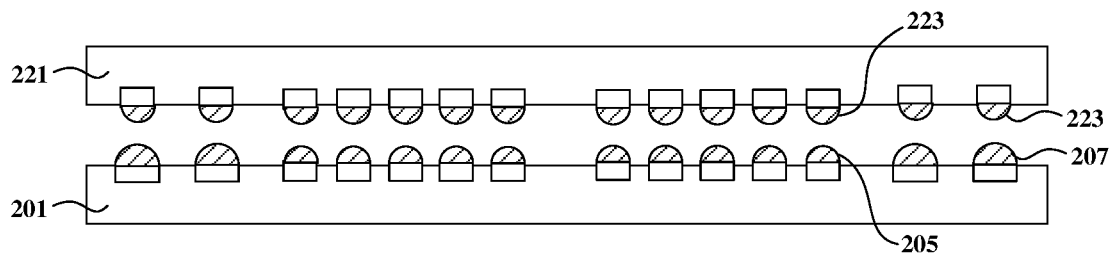
Figure 2D:
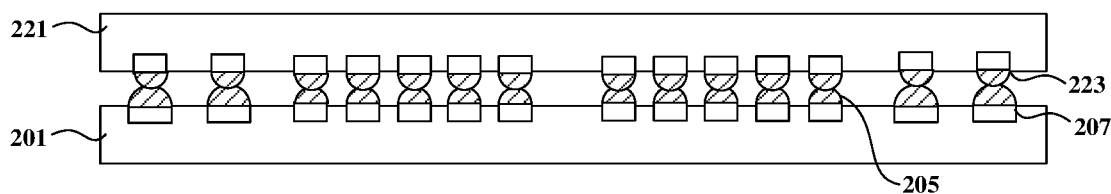

Next, as illustrated in FIG. 2C, a second substrate 221 may be provided. The second substrate 221 may have solder bumps 223 corresponding to and facing towards the first and second plurality of solder bumps 205 and 207. The second substrate 221 may be bonded with the first substrate 201 through the solder bumps 205, 207 and 223. In some embodiments, the solder bumps 223 may have a generally uniform shape and size, and flux may be formed on the solder bumps 223 using a dipping process. Further, as illustrated in FIG. 2D, the second substrate 221 is placed on the first substrate 201, with the solder bumps 223 aligned with and in contact with the respective ones of the first and second plurality of solder bumps 205 and 207.

Figure 2E:
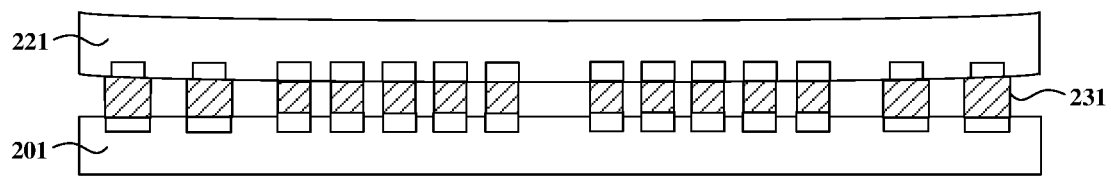

Next, as illustrated in FIG. 2E, a reflow process may be performed on the connected substrates 201 and 221 to reflow the solder materials between them. It can be appreciated, even if the upper substrate 221 warps at its periphery due to heat, the solder bumps at the periphery of the two substrate 201 and 221 may not be disconnected or not sufficiently wetted since there are plenty of solder materials that maintain wetting.

It can be appreciated that the process shown in FIGS. 2A to 2E are exemplary only, modifications, changes or additions can be made to the process. For example, in FIG. 2A, the substrate 201 may have other regions which are free of solder bumps, besides the exposed conductive patterns 203 in the peripheral region of the substrate 203. Moreover, different from FIG. 2A, in an alternative embodiment, the first plurality of solder bumps 205 may be formed after the second plurality of solder bumps 207.

The stencil masks according to the embodiments of the present application can be formed using any appropriate manners. In some preferred embodiments, the stencil mask can be formed using an in-suit forming process, that is, directly formed on a substrate where the stencil printing process will be performed later using the stencil mask. It can be appreciated that in some alternative embodiments, the stencil mask can be formed separately from the substrate and subsequently attached onto the substrate before the stencil printing process.

FIGS. 3A to 3H illustrate a process for forming a stencil mask according to an embodiment of the present application.

Figure 3A:
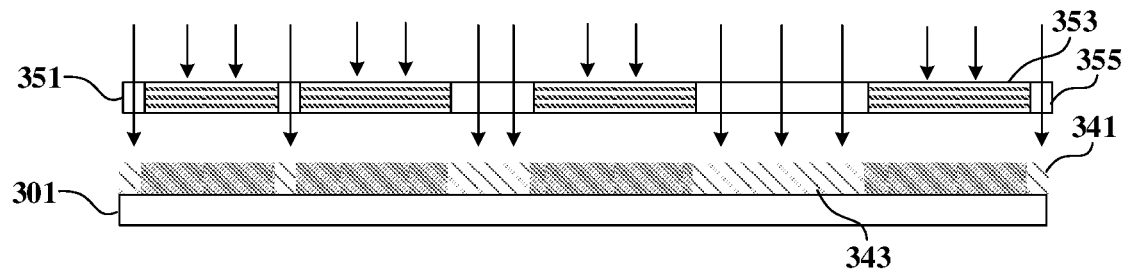
FIGS. 3A to 3H illustrate a process for forming a stencil mask according to an embodiment of the present application.
Figure 3B:
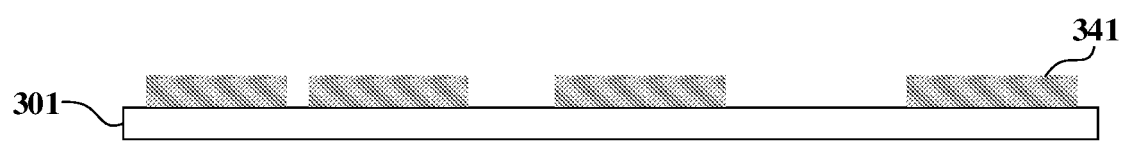

As illustrated in FIG. 3A, a substrate 301 is provided. The substrate 301 is formed with a first photoresist 341. In some embodiments, the first photoresist 341 can be either a positive photoresist or a negative photoresist, with slightly different subsequent processes and photomasks. In the embodiment, the first photoresistor 341 is a positive photoresist. A first photomask 351 is placed above the substrate 301, which has non-transparent regions 353 and transparent regions 355 such as windows or openings that allow light transmission. Light radiation such as an ultraviolet light can be emitted towards to the substrate 301 through the first photomask 351. As such, the first photoresist 341 on the substrate 343 can be selectively exposed, to form two portions, i.e., exposed portions 341 and non-exposed portions 343. The first photoresist 341 can be further developed by a developing solution such that the exposed portions 341 can be removed off the substrate 301, as shown in FIG. 3B.

Figure 3C:
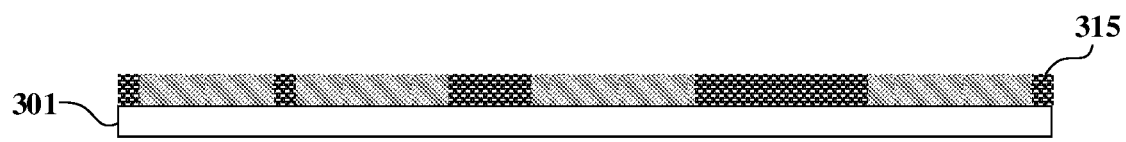
Figure 3D:
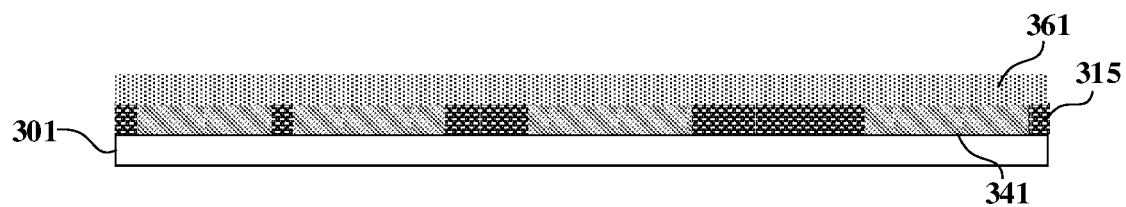

Afterwards, as illustrated in FIG. 3C, a first plating process may be performed to the substrate 301, to form first plating blocks 315 that fill at the positions where the exposed photoresist portions 341 were. The first plating blocks 315 form a supporting member of a stencil mask, such as the supporting bars 115 shown in FIGS. 1A to 1C. Next, a second photoresist 361 is further formed on the substrate 301 and above the first plating blocks 315 and the remaining portions of the first photoresist layer 341, as shown in FIG. 3D.

Figure 3E:
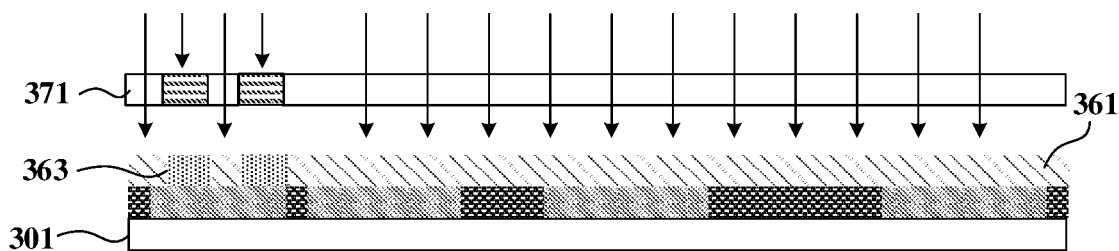
Figure 3F:

Next, as illustrated in FIG. 3E, a second photomask 371 is used to pattern the second photoresist layer 361, similar as the patterning of the first photoresist layer 341 shown in FIG. 3A. In particular, light radiation may be emitted toward the substrate 301 through the second photomask 371, which exposes a majority of the second photoresist layer 361, leaving only a portion 363 thereof unexposed. As shown in FIG. 3F, the second photoresist layer 361 can be further developed by a developing solution, to remove the exposed majority of the second photoresist layer 361, leaving only the non-exposed portion 363 on the substrate 301.

Figure 3G:
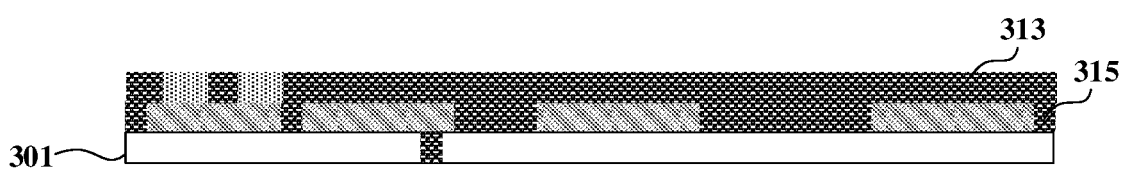
Figure 3H:
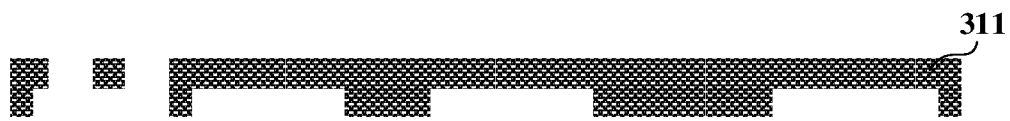

After that, as illustrated in FIG. 3G, a second plating process can be performed to the substrate 301, to form second plating blocks 313 that fill at the positions where the exposed photoresist portions 361 were. The second plating blocks 313 form a stencil member of the stencil mask, such as the stencil member 113 shown in FIGS. 1A to 1C. Next, as shown in FIG. 3H, all the remaining photoresists on the substrate 301 can be removed off the substrate 301, leaving the first and second plating blocks 313 and 315 on the substrate 301. In this way, the stencil mask 311 such as the stencil mask 111 shown in FIGS. 1A to 1C can be formed. In some embodiments, the stencil mask 311 may be further released from the substrate 301 for further stencil printing processes.

Figure 4A:
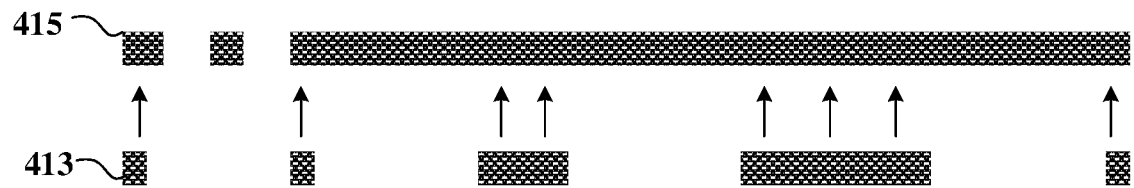
FIGS. 4A to 4B illustrate a method for forming a stencil mask according to another embodiment of the present application.
Figure 4B:

FIGS. 4A to 4B illustrate a method for forming a stencil mask according to another embodiment of the present application. As shown in FIG. 4A, a stencil member 413 and a supporting member 415 may be formed separately. In some embodiments, the stencil member 413 may be formed by an etching process or a laser cutting process. In some embodiments, a chemical etching or dry etching process may be employed to etch the stencil member. In some embodiments, a laser cutting process may be employed to etch the stencil member. The laser cutting process can be controlled automatically using a computer or similar electronic equipment, and therefore the size and depth of the etched portion can be accurate. The support member 415 may be formed using a similar process such as laser cutting, or any other suitable process. Then as shown in FIG. 4B, the stencil member 413 and the support member 415 may be aligned with each other and attached with each other. For example, an adhesive material may be used to attach the two together.

Although FIGS. 1A to 1C and FIGS. 2A to 2E illustrate some embodiments that incorporate two stencil printing process that form two sets of solder bumps separately, in some alternative embodiments such as below, a portion of the solder bumps on a substrate can be enhanced by depositing an additional amount of fluid material thereon, which can likewise reduce or avoid non-wetting defects.

Figure 5A:
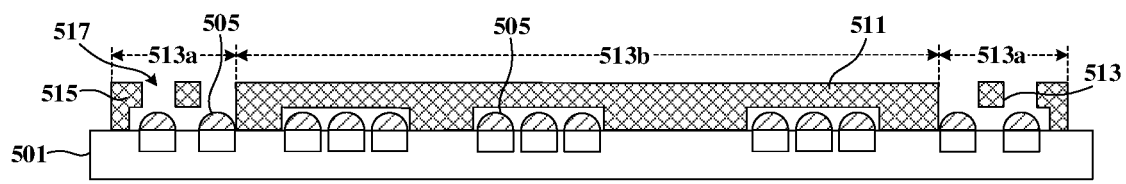
FIGS. 5A and 5B respectively illustrate a substrate with a stencil mask attached thereon, according to an embodiment of the present application.
Figure 5B:
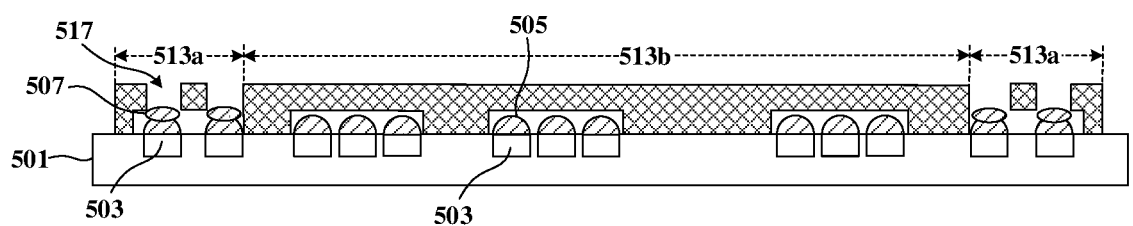

FIGS. 5A and 5B respectively illustrate a substrate 501 with a stencil mask 511 attached thereon, according to an embodiment of the present application. In particular, FIG. 5A is a cross sectional view of the substrate 501 before a fluid material is deposited onto the substrate 501 through the stencil mask 511, and FIG. 5B is a cross sectional view of the substrate 501 after the fluid material is deposited onto the substrate 501 through the stencil mask 511.

As shown in FIG. 5A, different from the embodiment shown in FIGS. 1A to 1C, solder bumps are formed in both a peripheral region 513a and a central region 513b of the substrate 501. However, due to the aforementioned die warpage issue that may occur in a subsequent bonding process or any other similar issues, it is desired to apply a fluid material such as flux or other materials that may improve wetting to the solder bumps in the peripheral region 513 of the substrate 501. Accordingly, a selective stencil mask 511 similar as the stencil mask 111 shown in FIGS. 1A to 1C are employed. The stencil mask 511 includes a stencil member 513 and a supporting member 515. The stencil member 513 includes at least one printing region that is aligned with the peripheral region 513a and a blocking region without apertures that is aligned with the central region 513b. Each of the printing regions has an array of apertures 517 that allow the fluid material to flow therethrough.

As shown in FIG. 5B, after the selectively stencil printing process is performed onto the substrate 501 using the stencil mask 511, the fluid material 507 such as flux can flow through the apertures 517 in the peripheral region 513a and be deposited on the solder bumps 505 which are formed during the previous printing process, to ensure that there are sufficient flux on the solder bumps 505 in the peripheral region 513a of the substrate 501. In this way, during the subsequent bonding process between the substrate 501 and another substrate (not shown), the solder bumps 505 with additional flux in the peripheral region 513a can be well wetted with the solder bumps on the another substrate, even if the another substrate may warp at its periphery during a reflow process, for example. It can be appreciated that the amount of fluid material such as flux printed in the printing process can be adjusted or controller according to the needs in practice.

FIGS. 6A to 6E illustrate a process for forming bonding between two substrates according to an embodiment of the present application. In some embodiments, the process can be used in a process for forming a semiconductor package including the two substrates.

Figure 6A:
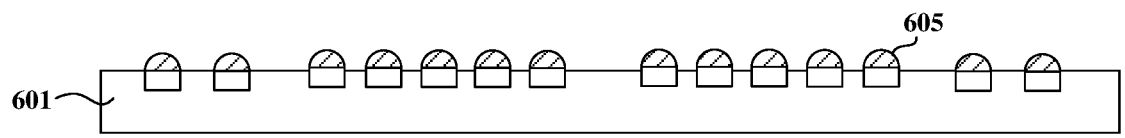
FIGS. 6A to 6E illustrate a process for forming bonding between two substrates according to an embodiment of the present application.

As illustrated in FIG. 6A, a first substrate 601 may be provided, which may have solder bumps 605 in both a central region and a peripheral region of the substrate 601. For example, the plurality of solder bumps 605 may be formed using a first stencil printing process, which may allow for a fine pitch such as 90 um or even smaller.

Figure 6B:
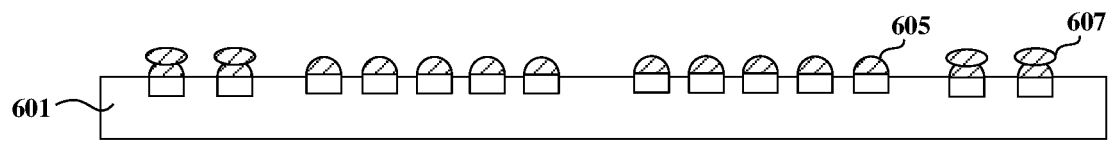

Afterwards, as illustrated in FIG. 6B, a second stencil printing process may be performed to the first substrate 601, to deposit on a portion of the solder bump 605 in the peripheral region of the substrate 601 a fluid material such as flux. In the embodiment, the second stencil printing process may be implemented using the stencil mask shown in the embodiment with reference to FIGS. 1A to 1C or FIGS. 5A to 5B. Since it is a process different from the first stencil printing process, the second stencil printing process may be implemented using a different configuration. For example, the aperture size and pitch of the stencil mask may be different from those for the first stencil printing process. The stencil mask used in the second stencil printing process provides a gap that can accommodate the solder bumps 605 in the central region of the substrate 601 and protect them from damages and contaminations during the second stencil printing process.

Figure 6C:
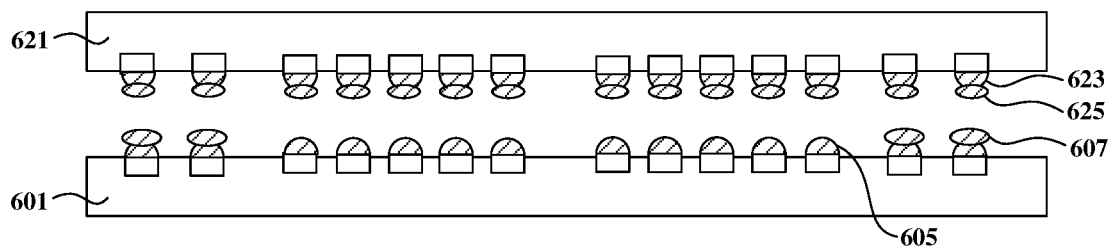
Figure 6D:
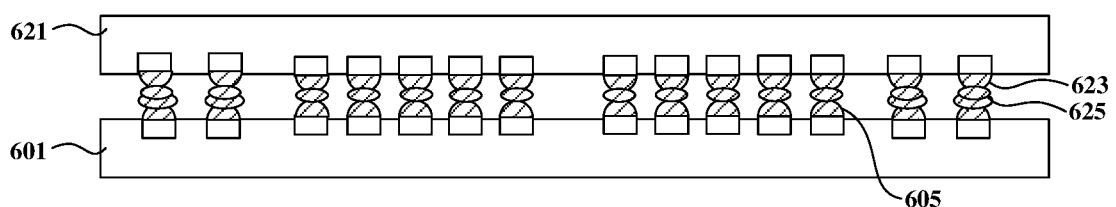

Next, as illustrated in FIG. 6C, a second substrate 621 may be provided. The second substrate 621 may have solder bumps 623 corresponding to and facing towards the solder bumps 605 on the substrate 601. The second substrate 621 may be bonded with the first substrate 601 through the solder bumps 605 and 623. In some embodiments, the solder bumps 623 on the second substrate 621 may be deposited with flux 625, for example, using a dipping process. Further, as illustrated in FIG. 6D, the second substrate 621 is placed on the first substrate 601, with the solder bumps 623 aligned with and in contact with the respective ones of the solder bumps 605, with flux 607 and flux 625 filled therebetween. The flux especially the additional flux 607 at the peripheral region of the substrates can improve wetting between the solder bumps on the substrates 601 and 621, thus reducing defects of the package formed.

Figure 6E:
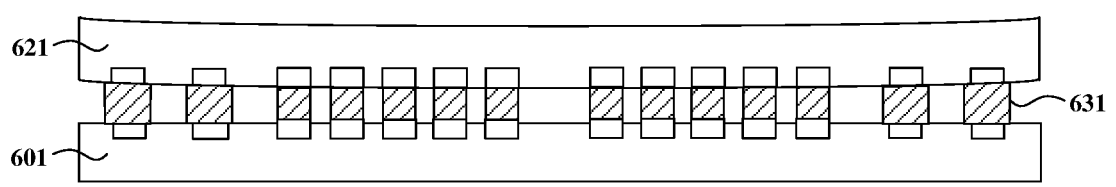

Next, as illustrated in FIG. 6E, a reflow process may be performed on the connected substrates 601 and 621 to reflow the fluid materials between them. It can be appreciated, even if the upper substrate 621 warps at its periphery due to heat, the solder bumps at the periphery of the two substrate 601 and 621 may not be disconnected or not sufficiently wetted since there are plenty of flux that maintains wetting.

It can be appreciated that the process shown in FIGS. 6A to 6E are exemplary only, modifications, changes or additions can be made to the process. For example, in FIG. 6B, the substrate 601 may have other regions which may need additional flux for the solder bumps already formed therein, i.e., the regions where non-wetting may occur in the subsequent bonding process. Moreover, in an alternative embodiment, the additional fluid materials may be deposited on the substrate 601 before the substrate-level deposition of solder bumps 605 as shown in FIG. 6A.

The discussion herein included numerous illustrative figures that showed various portions of a stencil mask and a stencil printing method based on such stencil mask. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

What is claimed is:

1. A method for forming a semiconductor package, comprising:
   providing a first substrate and a second substrate;
   forming in a first region of the first substrate a first plurality of solder bumps using a first stencil mask;
   forming in a second region of the first substrate a second plurality of solder bumps using a second stencil mask;
   forming solder bumps on the second substrate;
   aligning the first plurality of solder bumps and the second plurality of solder bumps on the first substrate with the solder bumps on the second substrate to connect the first substrate with the second substrate; and reflowing the first plurality of solder bumps and the second plurality of solder bumps on the first substrate and the solder bumps on the second substrate.

2. The method of claim 1, wherein the first region is at a central position of the first substrate, and the second region is at a peripheral position of the first substrate.

3. The method of claim 1, wherein the first plurality of solder bumps have a pitch that is smaller than that of the second plurality of solder bumps; and/or
wherein the first plurality of solder bumps have a size that is smaller than that of the second plurality of solder bumps.

4. The method of claim 1, wherein the second stencil mask comprises:
a stencil member comprising a printing region having an array of apertures that allow a solder material to flow therethrough and being aligned with the second region of the first substrate when the second stencil mask is placed on the first substrate; and a blocking region for preventing the solder material from flowing therethrough and being aligned with the first region of the first substrate when the second stencil mask is placed on the first substrate; and
a supporting member attached to the stencil member and configured to, when the stencil mask is placed on the substrate, contact the first substrate and create a gap between the second stencil member and the first substrate.

5. A method for forming a semiconductor package, comprising:
providing a first substrate and a second substrate;
forming in a first region of the first substrate a first plurality of solder bumps and in a second region of the first substrate a second plurality of solder bumps using a first stencil mask;
depositing onto the second plurality of solder bumps flux using a second stencil mask;
forming solder bumps on the second substrate;
aligning the first plurality of solder bumps and the second plurality of solder bumps on the first substrate with the solder bumps on the second substrate to connect the first substrate with the second substrate; and
reflowing the first plurality of solder bumps and the second plurality of solder bumps on the first substrate and the solder bumps on the second substrate.

6. The method of claim 5, wherein the first region is at a central position of the first substrate, and the second region is at a peripheral position of the first substrate.

7. The method of claim 5, wherein the first plurality of solder bumps have a pitch that is smaller than that of the second plurality of solder bumps.

8. The method of claim 5, wherein the first plurality of solder bumps have a size that is smaller than that of the second plurality of solder bumps.

9. The method of claim 5, wherein the second stencil mask comprises:
a stencil member comprising a printing region having an array of apertures that allow the flux to flow therethrough and being aligned with the second region of the first substrate when the second stencil mask is placed on the first substrate; and a blocking region for preventing the flux from flowing therethrough and being aligned with the first region of the first substrate when the second stencil mask is placed on the first substrate; and
a supporting member attached to the stencil member and configured to, when the stencil mask is placed on the substrate, contact the first substrate and create a gap between the second stencil member and the first substrate.

10. The method of claim 5, before aligning the first plurality of solder bumps and the second plurality of solder bumps on the first substrate with the solder bumps on the second substrate to connect the first substrate with the second substrate; the method further comprising:
forming flux on the solder bumps on the second substrate using a dipping process.

* * * * *